United States Patent
Sieg et al.

(10) Patent No.: US 12,196,028 B2
(45) Date of Patent: Jan. 14, 2025

(54) ARRANGEMENT FOR A VEHICLE

(71) Applicant: Huf Hülsbeck & Fürst GmbH & Co. KG, Velbert (DE)

(72) Inventors: Berthold Sieg, Bottrop (DE); Daniel Stahl, Wunstorf (DE)

(73) Assignee: Huf Hülsbeck & Fürst GmbH & Co. KG, Velbert (DE)

( * ) Notice: Subject to any disclaimer, the term of this patent is extended or adjusted under 35 U.S.C. 154(b) by 675 days.

(21) Appl. No.: 17/252,892

(22) PCT Filed: Dec. 11, 2019

(86) PCT No.: PCT/EP2019/084610
§ 371 (c)(1),
(2) Date: Dec. 16, 2020

(87) PCT Pub. No.: WO2020/120557
PCT Pub. Date: Jun. 18, 2020

(65) Prior Publication Data
US 2021/0254391 A1 Aug. 19, 2021

(30) Foreign Application Priority Data
Dec. 12, 2018 (DE) ...................... 10 2018 131 869.3

(51) Int. Cl.
*H03K 17/955* (2006.01)
*E05B 81/76* (2014.01)
*E05F 15/70* (2015.01)

(52) U.S. Cl.
CPC .......... *E05F 15/70* (2015.01); *H03K 17/955* (2013.01); *E05B 81/77* (2013.01); *E05Y 2400/44* (2013.01);
(Continued)

(58) Field of Classification Search
CPC ........ E05F 15/70; E05F 15/73; H03K 17/955; H03K 2217/960705; H03K 2217/960725;
(Continued)

(56) References Cited

U.S. PATENT DOCUMENTS 4,043,418 A * 8/1977 Blakeslee ................ B62D 1/28
180/168
4,157,510 A * 6/1979 Birchall ................ G08C 19/02
330/53

(Continued)

FOREIGN PATENT DOCUMENTS

CN 106325632 A 1/2017
DE 102013112909 A1 6/2014

OTHER PUBLICATIONS

Office Action for European Application No. 19824256.2 mailed on Jul. 12, 2023, with its English Translation, 12 pages.

(Continued)

*Primary Examiner* — Dale W Hilgendorf
*Assistant Examiner* — Frank T Glenn, III
(74) *Attorney, Agent, or Firm* — Peter W. Schroen; Christian S. Hans; Bret E. Field

(57) ABSTRACT

An arrangement for a vehicle is provided. The subject arrangement includes:
at least one sensor element for sensing a change, in particular an approach by an activation means, in the surroundings of the sensor element,
a controlling arrangement which is electrically connected to the sensor element to provide an electric sensor signal specific to a parameter of the sensor element, which in turn is specific to the sensed change in the surroundings,
an evaluation arrangement for repeatedly determining the parameter of the sensor element by means of a trans-
(Continued)

Figure 1:
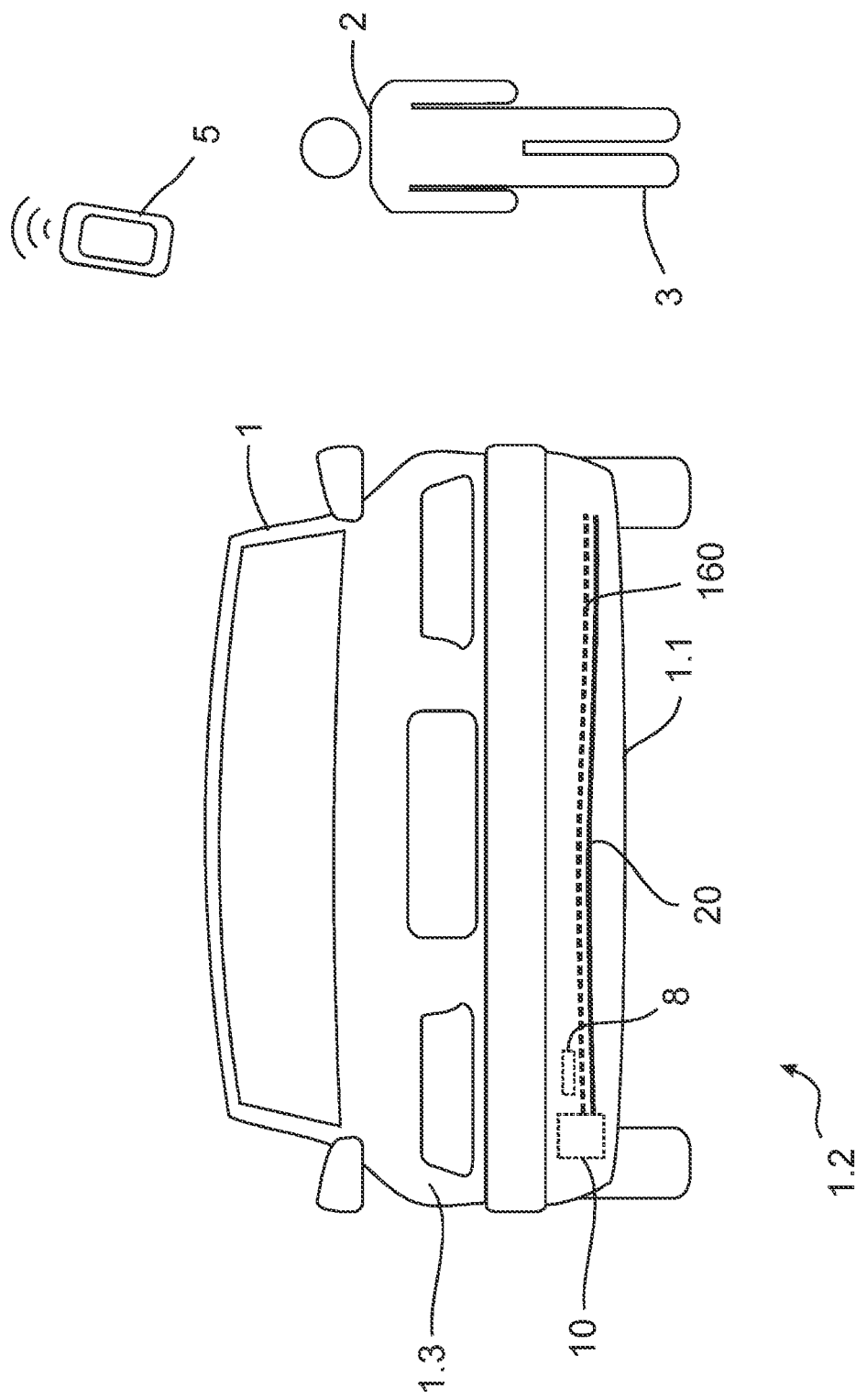

mission of the sensor signal to a storage arrangement in order to perform the detection of the activation action, and an evaluation filter arrangement of the evaluation arrangement for bandpass filtering and/or for transconductance conversion of the sensor signal for the transmission to the storage arrangement.

18 Claims, 7 Drawing Sheets

(52) U.S. Cl.
CPC ..... *E05Y 2400/45* (2013.01); *E05Y 2400/858* (2013.01); *E05Y 2400/86* (2013.01); *E05Y 2800/426* (2013.01); *E05Y 2900/531* (2013.01); *E05Y 2900/546* (2013.01); *E05Y 2900/548* (2013.01)

(58) Field of Classification Search
CPC .......... H03K 2217/96078; E05B 81/77; E05Y 2400/44; E05Y 2400/45; E05Y 2400/858; E05Y 2400/86; E05Y 2800/426; E05Y 2900/531; E05Y 2900/546; E05Y 2900/548; E05Y 2400/852
See application file for complete search history.

(56) References Cited

U.S. PATENT DOCUMENTS

| | | | | |
|---|---|---|---|---|
| 5,140,233 | A * | 8/1992 | Wallrafen | G01N 27/223 318/264 |
| 6,690,240 | B2 * | 2/2004 | Maxim | H03L 7/0893 327/156 |
| 8,693,286 | B1 * | 4/2014 | Rogers | G01S 5/30 367/100 |
| 2002/0030594 | A1 * | 3/2002 | Inaba | B60R 25/246 340/562 |
| 2003/0141906 | A1 * | 7/2003 | Turner | H04N 25/707 348/E5.091 |
| 2006/0187214 | A1 * | 8/2006 | Gillespie | G06F 3/0446 345/173 |
| 2008/0238135 | A1 * | 10/2008 | Takeda | E05F 15/42 296/146.4 |
| 2008/0252303 | A1 | 10/2008 | Kato et al. | |
| 2015/0062081 | A1 * | 3/2015 | Lee | G06F 3/044 345/174 |
| 2016/0364079 | A1 * | 12/2016 | Qiu | G06F 3/0418 |
| 2020/0110482 | A1 * | 4/2020 | Vu | H04L 9/38 |

OTHER PUBLICATIONS

Office Action for China Application No. 201980043844.5 mailed on Nov. 13, 2023, with its English Translation, 30 pages.

* cited by examiner

ARRANGEMENT FOR A VEHICLE

The present invention relates to an arrangement for a vehicle for detecting an activation action for activating a function on the vehicle. Furthermore, the invention relates to a system and a method.

It is known from the prior art that by means of a sensor element, such as a sensor electrode, a variable capacitance can be provided, which is specific for changes in the surroundings of the sensor element. This makes it possible to sense changes in the surroundings capacitively. In vehicles, such capacitive sensing can be used to detect approaches and/or gestures and thus activate functions on the vehicle.

Capacitive sensing is often based on the fact that the sensor element is evaluated by means of charge transfer. However, the shifting of electric charges can cause interfering emissions (interference effects of the sensor element on the surroundings). Furthermore, interfering influences from the surroundings (immissions on the sensor) can affect the sensing.

In addition, further interfering influences on the sensing are known, e.g. interfering capacitive effects (parasitic capacities, capacitive loads e.g. of the vehicle body, or similar).

It is therefore an object of the present invention to at least partially eliminate the disadvantages described above. In particular, it is an object of the present invention to provide an improved capacitive sensing.

The preceding object is solved by an arrangement with the features of the independent device claim, a system with the features of the independent system claim as well as by a method with the features of the independent method claim. Further features and details of the invention result from the respective dependent claims, the description and the figures. Features and details described in connection with the arrangement according to the invention are of course also valid in connection with the system according to the invention as well as the method according to the invention, and vice versa, so that with regard to the disclosure of the individual aspects of the invention reference is or can always be made to each other.

The object is solved in particular by an arrangement for a vehicle for detecting an activation action for the activation of a function on the vehicle.

In particular, it is intended that the activation action is performed in a front, side and/or rear region of the vehicle in order to initiate the activation of the function in the form of an opening and/or unlocking of a lid on the vehicle when the activation action is detected.

An arrangement according to the invention can comprise at least the following components, which are connected in particular with a printed circuit board of the arrangement:
- at least one (in particular electrically conductive) sensor element for sensing a change, in particular an approach by an activation means, in the surroundings of the sensor element,
- an (electronic) controlling arrangement which is electrically connected to the sensor element to provide an electric sensor signal specific to a parameter of the sensor element. In particular, it is intended that the parameter in turn is specific to the sensed change in the surroundings,
- an (electronic) evaluation arrangement for repeatedly determining the parameter of the sensor element by means of a transmission of the sensor signal to a storage arrangement in order to perform the detection of the activation action,
- an evaluation filter arrangement of the evaluation arrangement for band-pass filtering and/or for transconductance conversion (i.e. in particular conversion of an electric voltage into a corresponding electric current) of the sensor signal for the transmission to the storage arrangement.

In this way, the sensor signal for charging the storage arrangement can be provided so that the charge is specific to the parameter. This type of sensor evaluation is particularly robust against interfering influences due to the band-pass filtering.

The transconductance conversion can also be designed as a transconductance amplification to convert an input voltage into a (possibly over-) proportional output current. The input voltage is e.g. the sensor signal as a voltage signal, which is available at the output of a sensor controlling arrangement. The output current is e.g. the sensor signal converted by the evaluation filter arrangement, which is transmitted to the storage arrangement. The evaluation filter arrangement can comprise a transconductance operational amplifier or alternatively operate completely without operational amplifier. In the latter case the transconductance amplification can be realized with the amplification factor of maximum 1 (i.e. without amplification). The evaluation filter arrangement can comprise an impedance in series with a virtual zero point of the storage arrangement in order to transmit the sensor signal converted by the impedance as a current signal via this series connection to the storage arrangement.

This allows a charge accumulation in the storage arrangement depending on the amplitude of the voltage signal.

It may be possible that an operational amplifier is provided, e.g. the evaluation filter arrangement and/or the sensor controlling arrangement, which forms an active band-pass filter with further elements (such as a capacitor and/or a resistor and/or an inductor).

It is also advantageous if the vehicle is designed as a motor vehicle, in particular as a hybrid vehicle or as an electric vehicle, preferably with a high-voltage electrical system and/or an electric motor. It may also be possible for the vehicle to be designed as a fuel cell vehicle and/or a passenger car and/or a semi-autonomous or autonomous vehicle. Advantageously, the vehicle comprises a security system that enables authentication, e.g. by communication with an identification transmitter (ID transmitter). Depending on the communication and/or the authentication at least one function of the vehicle can be activated. If the authentication of the ID transmitter is necessary for this purpose, the function can be a security relevant function, such as unlocking the vehicle and/or enabling an engine start. Thus, the security system can also be designed as a passive access system, which initiates the authentication and/or the activation of the function without active manual actuation of the ID transmitter when the ID transmitter is detected approaching the vehicle. For this purpose, the security system repeatedly sends a wake-up signal which can be received by the ID transmitter during the approach and then triggers the authentication. The function can also concern the activation of a vehicle lighting and/or the actuation (opening and/or closing) of a lid (e.g. front or rear or side lid or door). For example, the vehicle lighting is automatically activated when the approach is detected and/or the lid is actuated when a gesture of a user is detected.

It is also conceivable that—for the activation of the function on the vehicle—an activation action is detected by an arrangement according to the invention. In particular, this could be an activation action outside the vehicle (i.e. not inside the vehicle interior). In other words, the surroundings of the sensor element in which the change is sensed can be outside the vehicle. If the activation action is successfully detected by the arrangement according to the invention, the function can be triggered and/or the authentication can be initiated by the arrangement (in particular by a controlling device). The activation action can be e.g. the approach and/or the gesture, which is carried out by means of the activation means. The activation means and/or the activation action can be detected advantageously even if the activation means is a non-electronic object (and thus not an ID transmitter). Instead, the activation means can be a non-electric and/or non-metallic and/or biological substance, such as a user's body part. Therefore, the use of capacitive sensing to detect the activation action is particularly advantageous as it does not require any special precautions to be taken at the activation means.

An arrangement according to the invention is advantageously designed as an electronic circuit (circuit arrangement) and comprises electronic components which are at least partially arranged on a printed circuit board and can be interconnected via electric conductor tracks. At least one of these components can also be designed as an integrated circuit (such as a controlling device in the form of a microcontroller). Some of the components can also be SMD (Surface-Mounted-Device) components. The sensor element can be electrically conductive, e.g. as a conductor track or as a flat electrode on the printed circuit board, or it can be connected to the printed circuit board via a supply line (like an electric line). In the latter case the sensor element is e.g. part of a cable (like a coaxial cable), a flat electrode or an elongated conductor. The sensor element can also be regarded as a capacitive antenna, since the sensor element provides a variable sensor capacitance. Furthermore, the variable sensor capacitance can optionally be provided by several sensor elements, which are operated simultaneously or alternately. The printed circuit board and/or the sensor element is e.g. integrated in a door handle or in a bumper. The sensor element can be arranged in such a way that the arrangement of the sensor element defines a detection region for the activation action.

In an arrangement according to the invention, it is possible that the sensor element is designed as a sensor electrode in order to provide the parameter specific for the sensing as a variable capacitance (also called sensor capacitance), wherein the change in capacitance can be specific for the change in the surroundings of the sensor element. In turn, at least one shield element can be used to shield a change in a region of the surroundings to be shielded from the sensor element so that this change does not significantly change the capacitance.

In addition, it may be provided that a control signal is used to control the sensor element and a sensor signal is used to evaluate the sensor element. The sensor signal can be dependent on the control signal. Also a charge transfer at the sensor element can depend on the control signal, because e.g. an electric voltage at the sensor element follows the control signal (or corresponds to the electric voltage of the control signal).

It may be intended that the sensor signal and/or the charge transfers at the sensor element essentially
comprise the same frequency (working frequency) as the control signal, and/or
comprise the same signal form as the control signal, preferably sinusoidal and/or a periodic oscillating form, and/or
comprise a frequency in a working frequency range, wherein the frequency (working frequency) of the control signal also lies in this working frequency range,
are in phase or with the same polarity, comprise the same DC voltage and/or DC current offset (or DC offset),
comprise a reduced frequency spectrum, which is adapted by a filter arrangement and/or an evaluation filter arrangement.

Furthermore, it is conceivable that the sensor signal is present as alternating current (or alternating voltage) at least after (or through) a filtering of an evaluation filter arrangement. A filtering by the evaluation filter arrangement can also be implemented as band-pass filtering. In contrast, filtering of the control signal, in particular by the filter arrangement, can be implemented as low-pass filtering in order to maintain a direct voltage component in the control signal.

Furthermore, it may be possible that the evaluation filter arrangement is designed to perform a transconductance conversion of the sensor signal as an alternative or in addition to the band-pass filtering. In the context of the invention, a transconductance conversion is understood to mean in particular that an electric voltage is converted into a proportional and preferably equal electric current. Functionally this can correspond to the function of a transconductance amplifier, if necessary with an amplification factor (proportionality factor) of maximum 1. However, in contrast to the transconductance amplifier, the evaluation filter arrangement cannot comprise an operational amplifier, but can achieve the transconductance conversion by means of the complex resistor and in particular by the connection in series with the virtual zero point.

The frequency of the sensor signal (as a periodic signal) can be dependent on a working frequency, i.e. in particular the frequency of the control signal at the output of a filter arrangement of the controlling arrangement. It is advantageous to use a single working frequency for the entire arrangement according to the invention both for the control and the evaluation, in particular capacitive sensor evaluation, of the sensor element in order to carry out the control and evaluation of the sensor element with a given working frequency range.

For this purpose, filtering is used in particular for the electric control (by the filter arrangement) and for the evaluation (by an evaluation filter arrangement), wherein the filtering is adapted to the working frequency (e.g. forms a low and/or band-pass for passing the working frequency range). This allows an optimal evaluation regarding EMC (electromagnetic compatibility) conditions (for emissions) and interfering influences (for immissions). Also, by generating the control signal and/or adjusting the signal form and/or frequency of the control signal, an emission of the sensor element and a susceptibility to immissions can be adjusted very precisely. In order to be able to use these adjusted features also for the sensor evaluation, the sensor signal can also be adapted according to the control signal. The sensor signal can be specific for the charge transfers and still shows the adjusted properties. For this purpose, e.g. a sensor controlling arrangement is used, which amplifies the control signal depending on the charge transfers (and thus the sensor capacitance of the sensor element) and outputs it as the sensor signal. This is possible e.g. by using an operational amplifier in the sensor controlling arrangement, which comprises a counter-coupling by means of a capacitor.

Preferably, the storage arrangement can be designed as an electronic integrator, in particular to accumulate received charges. Preferably several charge transfers after several charges and discharges of the sensor element can be used to charge the storage arrangement.

A further advantage can be achieved in the context of the invention if the controlling arrangement provides a control signal for an electric control of the sensor element for initiating charge transfers at the sensor element by means of the control signal, wherein the evaluation filter arrangement provides band-pass filtering with a center frequency and bandwidth which are adapted to a frequency and in particular signal form of the control signal in order to suppress interfering effects, preferably interfering immissions on the arrangement from the surroundings, during repeated determination and/or during the transmission to the storage arrangement. In other words, the sensor evaluation can be adapted to the electric control of the sensor element by using the evaluation filter arrangement. This allows a reduction of interference frequencies both in the control (with respect to emissions) and in the sensor evaluation (with respect to immissions).

Advantageously, it may be provided in the invention that a sensor controlling arrangement of the controlling arrangement is electrically interconnected to the sensor element in order to initiate charge transfers between the sensor element and the sensor controlling arrangement and to provide the sensor signal on the basis of the charge transfers, wherein the evaluation filter arrangement is electrically interconnected to the storage arrangement and to the sensor controlling arrangement in order to filter the sensor signal and transmit it filtered to the storage arrangement. Thus, the evaluation can be significantly improved and provided less susceptible to interference.

Preferably, it may be provided within the scope of the invention that the storage arrangement is serially interconnected to the evaluation filter arrangement via an input. Furthermore, an input resistance (in particular of a current input) of the storage arrangement can be so low that a virtual zero point is formed at the input, so that preferably the sensor signal filtered by the evaluation filter arrangement is present at the input as an electric current signal, in particular with the signal form and/or frequency, which comprises an electric voltage signal of the sensor element and/or a control signal. This has the advantage that the same working frequency can be used for the sensor evaluation as it is used for the electric control. In addition, the sensor signal can correspond to the unfiltered sensor signal (the voltage signal) with regard to amplitude and/or the amplitude can be proportional to a sensor capacitance of the sensor element. This enables a particularly reliable evaluation.

Optionally, the evaluation filter arrangement can be designed as a passive or active filter. This allows a simple and cost-effective construction.

Further, it is conceivable within the scope of the invention that the evaluation filter arrangement comprises a bandwidth in the range from 100 kHz to 1 MHz, preferably 250 kHz to 450 kHz and/or a center frequency of essentially 333 kHz. Such a frequency range has proven to be particularly advantageous for sensor evaluation. Alternatively, other center frequencies are conceivable, but the bandwidth should be relatively small.

It may be provided within the scope of the invention that the controlling arrangement comprises a filter arrangement, in particular an active filter and/or a low-pass filter and/or a band-pass filter, in order to provide an electric control signal for the electric control of the sensor element (in particular via a controlling path) filtered, in particular low-pass filtered, and/or formed, so that preferably an emission of the sensor element is adapted by the filter arrangement. Thereby, a frequency can be passed through the filter which corresponds to a working frequency and in particular the (middle) frequency of the control signal. The filtering of the evaluation filter arrangement can also be adapted to this working frequency and thus pass the working frequency.

For example, it may be provided that the controlling arrangement comprises a filter arrangement, in particular an active filter, which connects a signal generator arrangement via a controlling path to the sensor element in order to provide an electric control signal generated by the signal generator arrangement at the controlling path filtered, in particular low-pass filtered, and/or formed for the sensor element, and thereby provide it as a filtered electric signal, preferably a sinusoidal signal. The controlling path may also be provided with a sensor controlling arrangement which uses the control signal to initiate charging and discharging of the sensor element. The charges and discharges are thus carried out in dependence on the control signal, so that in particular the charge transfers of the charge and discharge are carried out periodically with the working frequency. Thus, the control signal not only enables the control of the charge transfers, but also an emission of the sensor element.

According to a further advantage, it can be provided that the evaluation filter arrangement is provided in addition to a filter arrangement of the controlling arrangement in order to additionally filter immissions on the sensor element for the determination of the parameter, wherein preferably the filter arrangement is designed to filter a control signal for the sensor element and the evaluation filter arrangement is designed to filter the sensor signal for the storage arrangement. Thus, the overall interference behavior of the sensor can be improved.

A further advantage may be obtained in the context of the invention if the sensor element is designed as a sensor electrode to provide the parameter specific to the sensing as a variable capacitance, wherein the change of the capacitance is specific to the change in the surroundings, wherein the arrangement is adapted for the repeated determination to:
  repeatedly initiate charge transfers by means of a control signal between the sensor element and a sensor controlling arrangement, and in response thereto
  repeatedly initiate charge transfers by means of the sensor signal between the sensor controlling arrangement and the storage arrangement, in particular an integrator, of the evaluation arrangement,
so that the electric charge stored by the storage arrangement is specific to the change in the capacitance. This enables a particularly reliable sensor evaluation. In particular, the provision of different charge transfers by the sensor controlling arrangement can cause a kind of "decoupling", in particular a reduced load on the sensor element and/or distortion of the control signal. For this purpose, the sensor controlling arrangement can use at least one amplifying element like an operational amplifier.

Furthermore, it may be provided within the scope of the invention that a controlling device is interconnected to the storage arrangement of the evaluation arrangement in order to evaluate an electric charge stored by the storage arrangement for determining the parameter specific to the sensing, preferably by an analogue-digital conversion of a voltage at the storage arrangement, preferably by an analogue-digital converter of the controlling device. In addition to or as an alternative to the analogue-digital conversion, the evaluation can use other measuring methods, if necessary, to obtain a measured value for the voltage that is as accurate as possible.

Optionally it is conceivable that the arrangement is at least partially integrated as a capacitive sensor arrangement in a bumper of the vehicle in order to monitor the rear region of the vehicle and in order to open the tailgate (and/or front lid and/or sliding door on one side) of the vehicle as the function on the vehicle, in particular in order to initiate an output of an opening signal and/or an authentication check. This enables a comfortable access to the vehicle.

It is also optionally conceivable that the arrangement is designed to repeatedly charge and discharge the sensor element by an electric control of the sensor element, and to carry out charge transfers by the sensor signal to the storage arrangement depending on this charging and/or discharging, wherein a controlling device, in particular at least one microcontroller, is electrically connected to a signal generator arrangement, in order to initiate the electric control at the signal generator arrangement, and/or is electrically connected to the storage arrangement, in order to evaluate, after a charge transfer, the amount of charge stored in the storage arrangement and/or accumulated after several charge transfers, and to perform the detection on the basis of the evaluation, preferably in order to output an activation signal for activating the function on the vehicle if the amount of charge exceeds a limiting value. This has the advantage that the controlling device can be used to synchronize the control and sensor evaluation to make the evaluation particularly reliable.

Furthermore, within the scope of the invention it is optionally possible that a sensor controlling arrangement is electrically interconnected to the sensor element in order to generate an electric voltage signal with a specific frequency and/or signal form, preferably sinusoidal form, at an output on the basis of a control signal and/or on the basis of charge transfers at the sensor element, wherein the evaluation filter arrangement is designed to convert the voltage signal into an electric current signal with substantially the same signal form and/or frequency for charge transfers to the storage arrangement, so that the sensor signal is produced as the electric current signal (in particular by the transconductance conversion), wherein preferably the signal form and/or frequency of the voltage signal corresponds to the signal form and/or frequency of the control signal. This has the advantage that a frequency spectrum and thus the susceptibility to interference for frequencies outside the operating frequency can be reduced during the sensor evaluation. In addition, the current signal can be dependent on the parameter of the sensor element, thus enabling a reliable evaluation.

It may be provided within the scope of the invention that a rectifier arrangement is interconnected between the evaluation filter arrangement and the storage arrangement in order to forward only charge transfers by the sensor signal in the direction of the storage arrangement to the storage arrangement by repeated switching, and preferably only during this forwarding to connect a virtual zero point of the storage arrangement to the evaluation filter arrangement and in particular to a compensation arrangement, and preferably otherwise to connect the evaluation filter arrangement to a ground potential. In this way, a load on the evaluation filter arrangement can be significantly reduced and the sensor signal can be transmitted particularly reliably and unaltered in order to further reduce the susceptibility to interference.

The subject of the invention is also a system comprising:
an arrangement according to the invention,
a controlling device for outputting an activation signal in the case of the detection of the activation action (by the arrangement according to the invention, wherein the controlling device is in signal technical connection with the arrangement according to the invention for this purpose),
a control apparatus which is connected to the controlling device (in particular in a signal technical manner) in order to perform the function on the vehicle when the activation signal is received.

Thus, the system according to the invention has the same advantages as they have been described in detail with respect to an arrangement according to the invention.

Also subject of the invention is a method for a vehicle for detecting an activation action for activating a function on the vehicle, in particular in a front, side and/or rear region of the vehicle for activating an opening and/or unlocking of a lid on the vehicle. A sensor element is provided for sensing a change, in particular an approach by an activation means, in the surroundings of the sensor element.

Here it is intended that the following steps are carried out, preferably one after the other in the specified or in any order, wherein the steps can be carried out at least partially in parallel and/or synchronized and/or repeated:
providing an electric sensor signal which is specific for a parameter of the sensor element, wherein the parameter in turn is specific for the sensed change in the surroundings,
performing a repeated determination of the parameter of the sensor element by means of a transmission of the sensor signal to a storage arrangement,
performing band-pass filtering and/or transconductance conversion of the sensor signal for the transmission to the storage arrangement.

Thus, the method according to the invention has the same advantages as they have been described in detail with respect to an arrangement according to the invention. In addition, the method may be suitable for operating an arrangement according to the invention.

Figure 2:
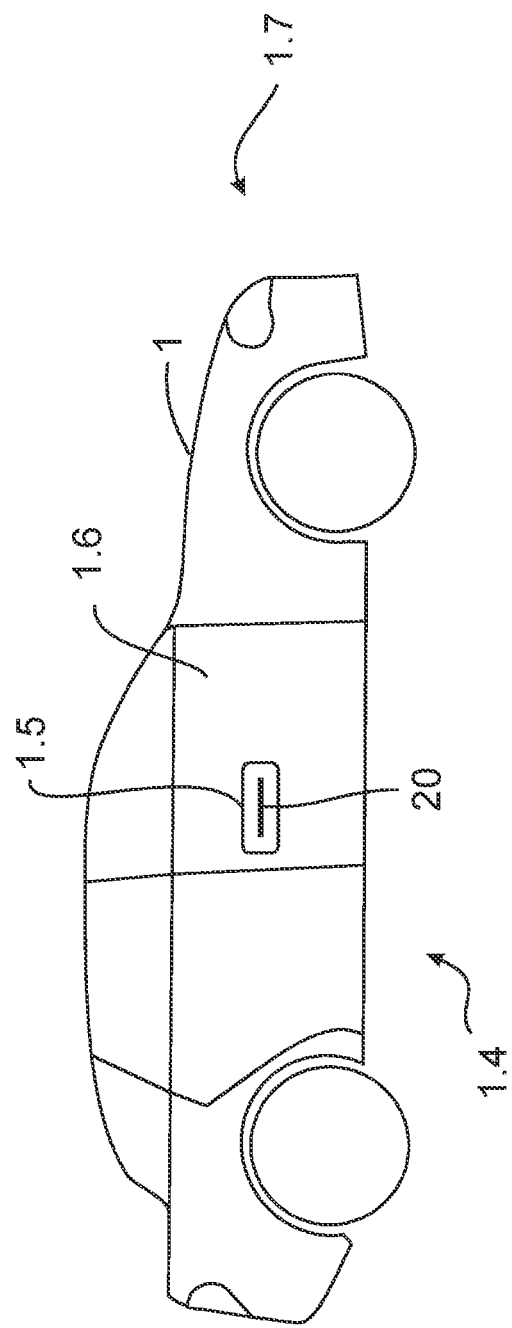
Figure 3:
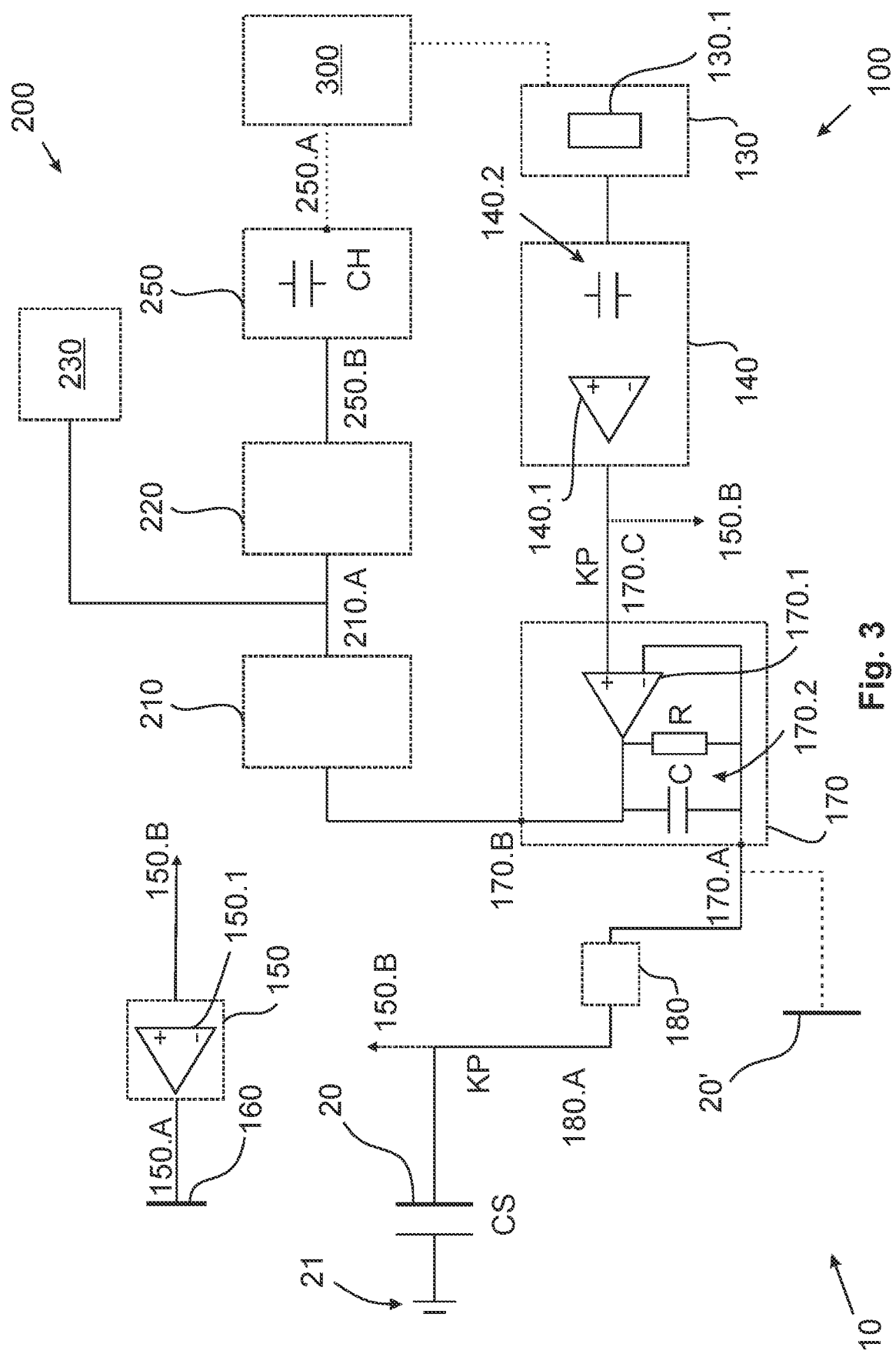
Figure 4:
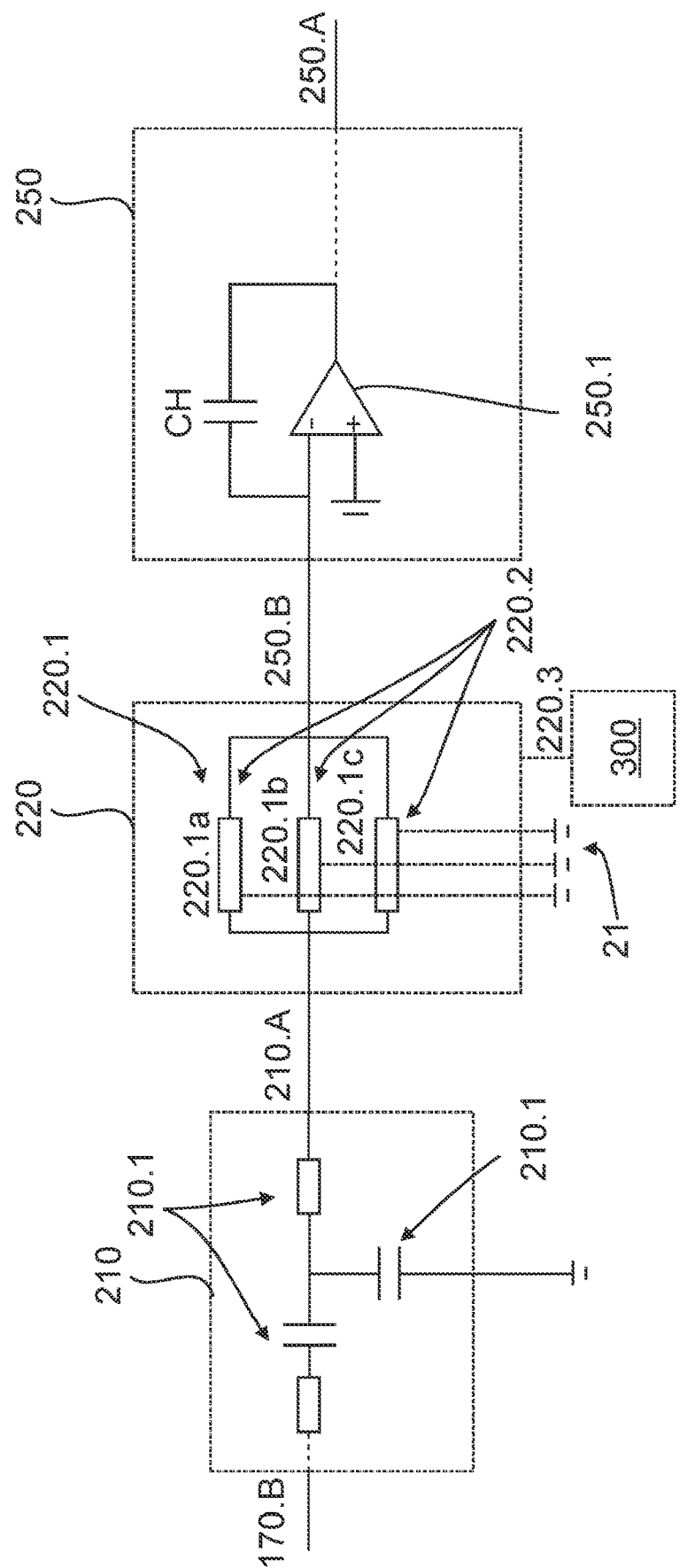
Figure 5:
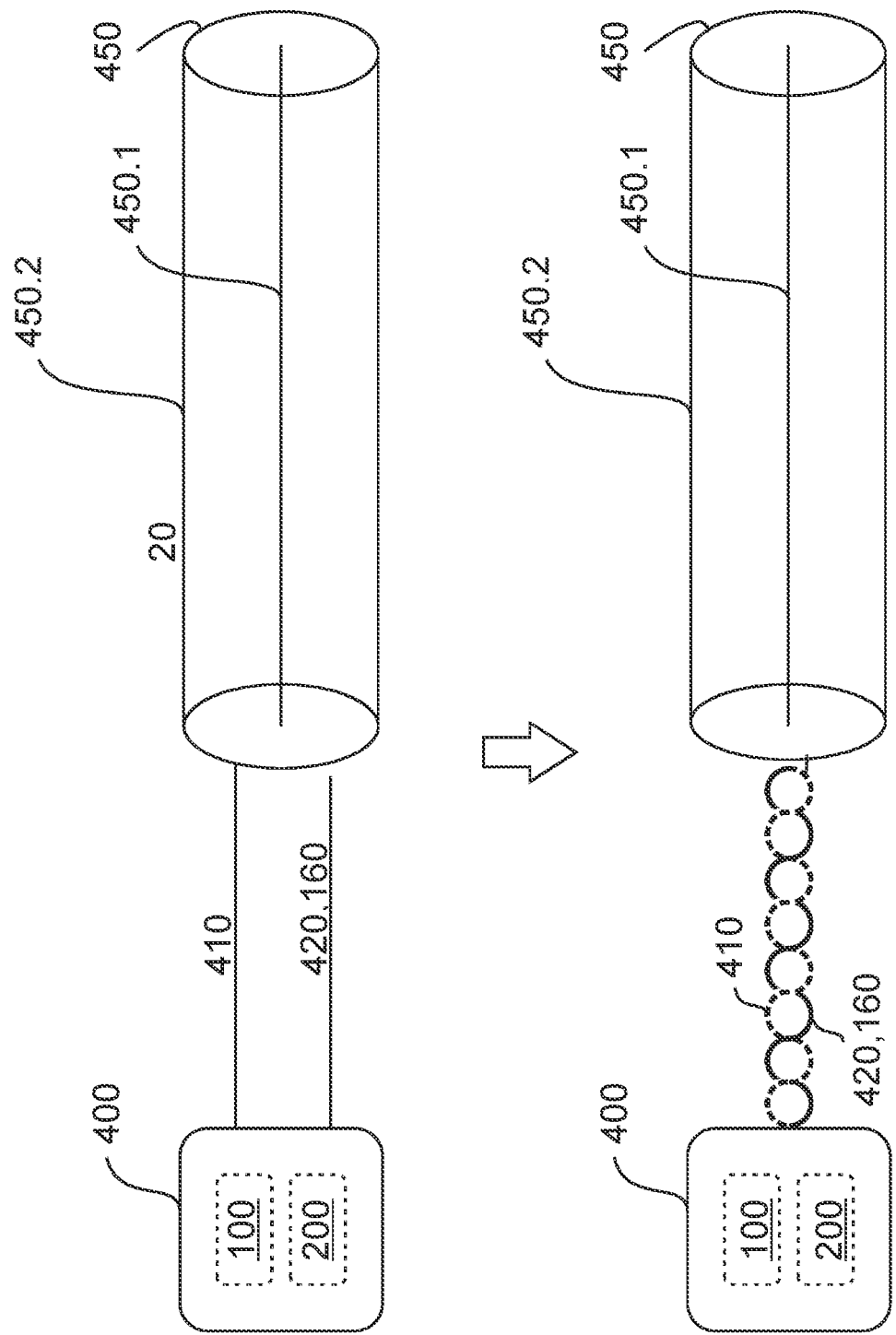
Figure 6:
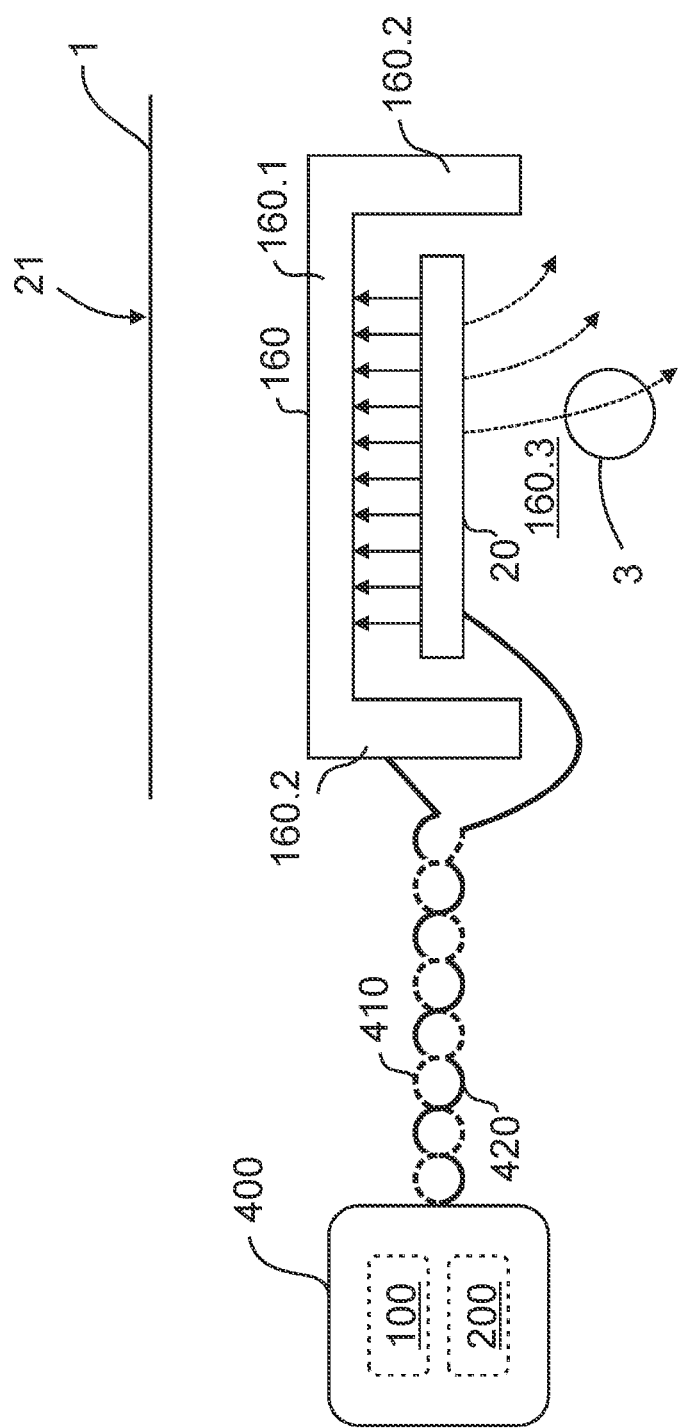
Figure 7:
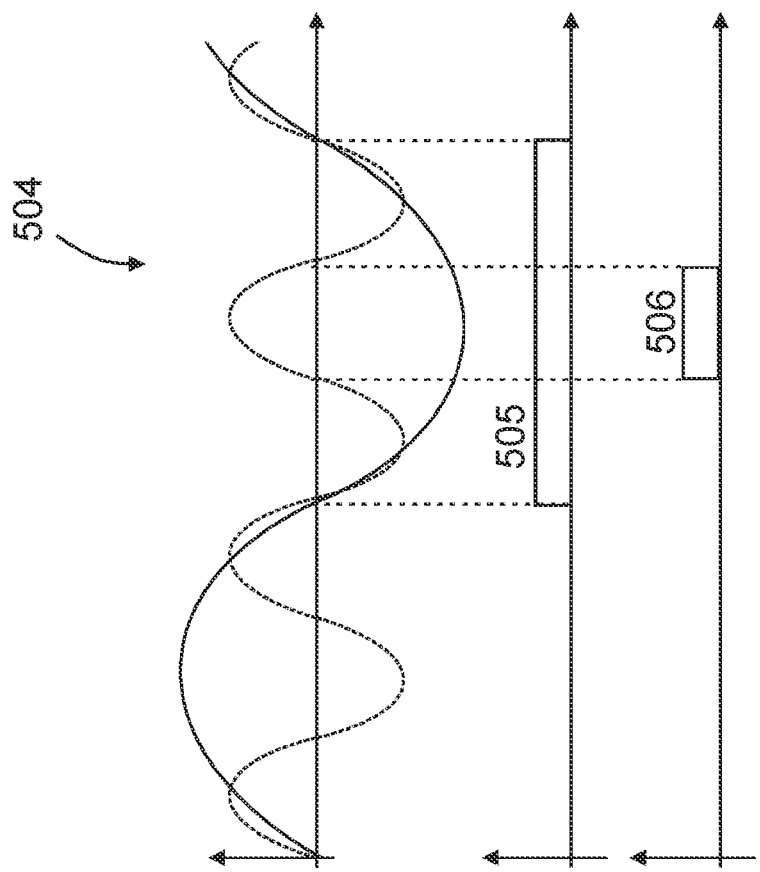
Figure 7:
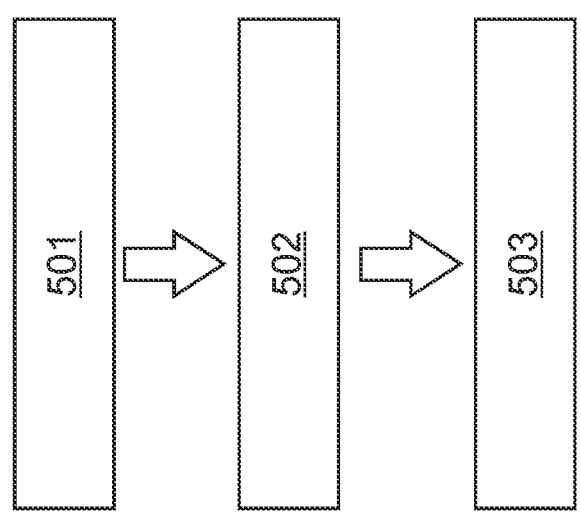

Further advantages, features and details of the invention result from the following description in which, with reference to the figures, embodiments of the invention are described in detail. The features mentioned in the claims and in the description may be individually or in any combination essential to the invention. The figures show:

FIG. 1 a schematic view of a rear region of a vehicle with an arrangement according to the invention and a system according to the invention, FIG. 2 a schematic side view of a vehicle with an arrangement according to the invention and a system according to the invention, FIG. 3 a schematic diagram of parts of an arrangement according to the invention, FIG. 4 a schematic diagram of parts of an arrangement according to the invention, FIG. 5 a schematic representation of parts of an arrangement or system according to the invention, FIG. 6 a schematic representation of parts of an arrangement or system according to the invention, and FIG. 7 a schematic representation for the visualization of a system according to the invention.

In the following figures, the identical reference signs are used for the same technical features even from different embodiments.

FIG. 1 shows a view of a rear region 1.2 of a vehicle 1 with a system according to the invention. An arrangement 10 according to the invention may be integrated in a bumper 1.1 of the vehicle 1 to detect an activation action by an activation means 3 (such as a leg 3) of a user 2 in the region of the bumper 1.1. For this purpose, the arrangement 10 comprises a sensor element 20, which can be e.g. an elongated and/or cable-formed electrode 20 or a plane electrode 20 (i.e. flat electrode) or a capacitive antenna. It is also possible that a cable, like a coaxial cable, is used to form the sensor element 20. A detection of the activation action can cause a tailgate 1.3 of the vehicle 1 to open. For this purpose, the arrangement 10 can comprise a signal connection with a control apparatus 8 of the vehicle 1 in order to output an activation signal to the control apparatus 8 via the signal connection, which initiates the opening of the tailgate 1.3. A prerequisite for the opening can be a successful authentication with an identification transmitter 5 if necessary. In the same way, a lid (in particular door 1.6) in the front region 1.7 and/or in the side region 1.4 of the vehicle can be activated by an arrangement 10 according to the invention, wherein the arrangement 10 is then integrated e.g. in the door handle 1.5 or also in the bumper 1.1 or at a side sill.

FIG. 2 schematically shows a vehicle 1 in a side view. The side region 1.4 and/or the front region 1.7 of the vehicle 1 may alternatively or in addition to the rear region 1.2 comprise an arrangement 10 according to the invention. For example, the sensor element 20 in the side region 1.4 is integrated into a door handle 1.5 of the vehicle in order to detect the activation action in the region of the door handle 1.5. For example, an approach to the sensor element 20 can be detected as an activation action by the arrangement 10 in the side region 1.4. This activation action can comprise an engagement of an activation means 3 (like a hand) into a door handle recess of the door handle 1.5. The arrangement of the sensor element 20 in the front region 1.7 can again be provided in the bumper 1.1, e.g. to open a front lid when detecting the activation action in the front region 1.7. Another possible function which can be activated by an activation action can be the opening of sliding doors 1.6 of the vehicle 1, e.g. by approaching a side sill of the vehicle.

Basically, the activation action can comprise an approach to the sensor element 20 or a gesture or the like. In particular, for the detection of gestures, at least one further sensor element 20' can be provided in addition to a single sensor element 20, and can be arranged adjacent to the sensor element 20. This makes it possible to recognize a movement of the activation means by the different sensing of the sensor elements 20, 20'. Likewise, a shield element 160 for shielding can be arranged adjacent to the sensor element 20 and/or further sensor element 20'. FIG. 1 shows an example of this arrangement in the bumper 1.1.

FIG. 3 shows an inventive arrangement 10 for a vehicle 1 which is used for the detection of an activation action for the activation of a function on the vehicle 1, in particular as described in FIGS. 1 and 2 for the detection of the activation action in a front, side and/or rear region 1.7, 1.4, 1.2 of the vehicle 1 for the activation of an opening and/or unlocking of a lid 1.3, 1.6, in particular door 1.6 on the vehicle 1.

The arrangement 10 according to the invention may comprise at least one sensor element 20 for sensing a change in the surroundings of the sensor element 20. This change is e.g. caused by the activation action, e.g. an approach by an activation means 3. The sensor element 20 can be designed as an electric conductor, such as an electrically conductive surface (in particular when mounting the arrangement 10 in the door handle 1.5) or an elongated and possibly flat electrode (in particular when mounting in the bumper 1.1).

The sensitivity of the sensor element 20 to changes in the surroundings and thus to the activation action can be explained in a simplified way, for example, as follows. In relation to the surroundings and/or a ground potential 21, the sensor element 20 can form a capacitance (in the following also called sensor capacitance CS). By generating an electric potential (by means of an electric control described in the following) at the sensor element 20 an electric field can be created in the surroundings. The sensor capacitance CS is influenced by the change in the surroundings and is therefore variable. In other words, the change in sensor capacitance CS correlates with the change in the surroundings, i.e. the presence of an activation action. An evaluation of the variable capacitance CS can be done in particular by evaluating the amount of charge stored in the sensor element 20 and provide conclusions about the change in the surroundings, and thus serve to detect the activation action. Thus, in particular the execution of charge transfers from and to the sensor element 20 is suitable to provide a sensor signal based on the charge transfers (like the transferred amount of charge and/or the current and/or voltage to be sensed), which can be evaluated for the determination of the variable capacitance CS.

To perform the electric control, a controlling arrangement 100 (in the sense of a control arrangement 100) can be used. The controlling arrangement 100 can be electrically interconnected to the sensor element 20 via a controlling path KP to provide (i.e. enable) the sensing. By means of the electric control, e.g. a (forced) charging and discharging of the sensor element 20 can be initiated via charge transfers in order to allow capacitive sensing by means of this control of the sensor element 20. The electric interconnection can be realized e.g. by means of an electric connection via conductor tracks of a printed circuit board. The arrangement 10 according to the invention can be arranged at least partially on this circuit board as an electric circuit. The sensor element 20 and/or the further sensor element 20' and/or the at least one shield element 160 can be electrically connected to the controlling arrangement 100 of the arrangement 10 via conductor tracks via an electric terminal of the circuit board, or it can itself be designed as a conductor track. The sensing is provided, for example, by the fact that an electric potential is generated by the controlling arrangement 100 at the sensor element 20 in order to charge the sensor element 20, thus enabling, for example, the evaluation of the variable capacitance CS as described above. It can also be a changing potential, so that an electric voltage is generated at the sensor element 20, e.g. as a periodic and/or sinusoidal voltage. For the evaluation of the sensor element 20 an evaluation arrangement 200 is provided, which carries out a repeated determination of at least one parameter of the sensor element 20 specific for the sensing in order to carry out the detection of the activation action. In the concretely described example the variable capacitance CS is considered as this parameter.

In addition, it is possible that at least one shield element 160 is provided, which is arranged adjacent (and thus in the effective range) to the sensor element 20 for shielding the sensor element 20. To enable shielding by the shield element 160, a shield controlling arrangement 150 with a terminal 150.A for the shield element 160 is provided. The shield controlling arrangement 150 can be electrically connected to the controlling path KP and thus also to the shield element 160 via a shield controlling input 150.B to provide the (previously described) electric control of the controlling arrangement 100 for the shield element 160. In other words, the shield controlling arrangement 150 can provide the same electric control for the shield element 160 as is used for the sensor element 20. For this purpose, an electric output voltage at the output 150.A of the shield controlling arrangement 150, which is electrically connected to the shield element 160, follows an input voltage at the input 150.B of the shield controlling arrangement 150, which in turn is electrically connected to the controlling path KP and thus is also interconnected to the sensor element 20. For the sensor element 20 and for the shield element 160 an identical control signal can be used in this way to adjust the potential at the sensor element 20 and at the shield element 160 in the same way by means of the control signal.

A connection point on the controlling path KP can be used to connect the shield controlling arrangement 150 with the controlling path KP. For this purpose, different positions on the controlling path KP can be used, e.g. directly on the current path to sensor element 20 or between a filter arrangement 140 and a sensor controlling arrangement 170. FIG. 3 shows an example of two possible connection points of the shield controlling input 150.B with the shield controlling arrangement 150. When using the connection point at the terminal 170.C of the sensor controlling arrangement 170, the control signal output by the filter arrangement 140 can be used to set the potential at the shield element 160. When using the connection point directly on the current path to the sensor element 20, the (essentially) same potential is used to set the potential on the shield element 160 as is applied to the sensor element 20.

In order to adjust the electric control particularly reliably, and in particular not to overload the components at the connection point (such as the sensor element 20 or the controlling arrangement 100), the shield controlling arrangement 150 can comprise an operational amplifier 150.1 for the electric forced guidance of the shield element 160. This can be used to connect the controlling path KP to the shield element 160 and thus generate the output voltage (also called shield voltage) at the shield element 160 equal to the input voltage at the controlling path KP. The input voltage corresponds to a control voltage which is specific and/or proportional to the voltage at the sensor element 20. Preferably, the shield controlling arrangement 150 can form a voltage follower so that an electric potential at the shield element 160 follows the electric potential at the controlling path KP and in particular at the sensor element 20. Accordingly, a direct counter-coupling of the operational amplifier 150.1 can be provided to obtain an amplification factor of 1. In this case, the shield controlling input 150.B can be electrically connected (directly) to the positive (non-inverting high-impedance) input of the operational amplifier 150.1, so that the input resistance of the shield controlling input 150.B is very high in order to load the voltage at the shield controlling input 150.B only slightly. The shield element terminal 150.A, on the other hand, can be electrically connected to the output of the operational amplifier 150.1 and, due to the counter-coupling, possibly also to the inverting input of the operational amplifier 150.1 (directly) in order to provide an output with low resistance compared to the input resistance.

Furthermore, FIG. 3 shows that the controlling arrangement 100 comprises a signal generator arrangement 130, which is electrically interconnected to the sensor element 20 for the electric control of the sensor element 20 in order to repeatedly generate an electric signal for charging the sensor element 20. This electric signal, hereinafter also referred to as the control signal, can be used for the described electric control, and can thus be provided for the sensor element 20, possibly also for the further sensor element 20', and in particular also for the at least one shield element 160 for setting the electric potential and/or for electric charging and discharging. This provision takes place, for example, by transmitting the electric signal via at least a part of the controlling path KP to a sensor controlling arrangement 170 and/or to a shield controlling arrangement 150. The generation of the control signal by the signal generator arrangement 130 thus causes the control signal (possibly previously modified, in particular filtered) to be present at the terminal 170.C. By means of the sensor controlling arrangement 170 and/or the shield controlling arrangement 150, the sensor element 20, the further sensor element 20' and/or the shield element 160 can be controlled by the control signal. For this purpose, a charge transfer (charging and/or discharging) is initiated at the sensor element 20 and/or the further sensor element 20' and/or the shield element 160 by means of the control signal (and thus also the generation of an electric field is initiated). The evaluation of the amount of the transferred charge can enable an evaluation of the variable sensor capacitance CS. The time development of this charge transfer can be influenced by the forming of the electric signal. For this purpose, the signal generator arrangement 130 comprises e.g. a digital-analogue converter 130.1, which can also be designed as part of a controlling device 300 like a microcontroller. The signal generator arrangement 130 can also be part of the controlling device 300. It is also conceivable that the signal generator arrangement 130 is only partially integrated into the controlling device 300 and that, for example, the digital-analogue converter 130.1 is designed separately. Thus, a certain signal form of the control signal can be determined very reliably and exactly. This signal form can be further formed and/or improved by subsequent filtering, if necessary, so that the control signal then comprises, for example, a sinusoidal form according to an operating frequency. Therefore, the controlling arrangement 100 can comprise a filter arrangement 140, in particular an active filter 140 e.g. a low pass filter. This can be connected downstream of the signal generator arrangement 130 as shown in the illustration in order to output the control signal for the electric control of the sensor element 20 via the controlling path KP filtered to the sensor controlling arrangement 170, in particular by low-pass filtering. In this way, the control signal can be formed with a certain working frequency, so that preferably an emission of the sensor element 20 by the filter arrangement 140 is adapted. This is advantageous for implementing EMC (electromagnetic compatibility) requirements during operation of the arrangement 10. In other words, the controlling arrangement 100 can comprise a filter arrangement 140, in particular an active filter 140, which connects the signal generator arrangement 130 to the controlling path KP in order to provide an electric signal generated by the signal generator arrangement 130 at the controlling path KP filtered, in particular low-pass filtered, and/or formed, and thereby provide it as a filtered electric signal, preferably a sinusoidal signal. The active filtering is thereby preferably enabled by an operational amplifier 140.1 and by filter elements 140.2 such as at least one capacitor and/or at least one resistor and/or at least one coil.

The electric signal (control signal) at the controlling path KP and in particular at the terminal 170.C can now be output to the sensor element 20 via further components such as the sensor controlling arrangement 170 and via a switching element 180 (if necessary via a terminal 180.A). In order to interrupt the charge transfer to sensor element 20 and, e.g., to charge at least one further sensor element 20', the switching element 180 can be opened and closed in a clocked fashion. The sensor controlling arrangement 170 can comprise an amplifier and/or a voltage follower and/or a voltage multiplier to generate an electric potential at the terminal 170.C in the same way at the sensor element 20, preferably so that the electric potential at the sensor element 20 follows the electric potential at the terminal 170.C. For this purpose, the sensor controlling arrangement 170 comprises e.g. an operational amplifier 170.1 and/or at least one filter element 170.2, such as a capacitor 170.2. A further switching element 180 can be integrated e.g. in the path between the terminal 170.A and the further sensor element 20' and can be switched e.g. alternately with the switching element 180.

The sensor controlling arrangement 170 can comprise the operational amplifier 170.1 as a transmission element 170.1, which is electrically interconnected to the signal generator arrangement 130 in order to initiate repeated charge transfers at the sensor element 20 on the basis of the control signal (at the terminal 170.C). This enables at least partial charging and discharging of the sensor element 20, and thus an evaluation of the charge stored in the sensor element 20. For this purpose, e.g. a quantity (number) of the transferred charges and/or a current intensity during the charge transfers can be evaluated. The charge quantity and/or current intensity is then specific for the sensor capacitance CS, in particular for the change of the sensor capacitance CS. For this evaluation of the sensor element 20, the sensor controlling arrangement 170 can further comprise the at least one filter element 170.2 as an amplifying means 170.2, which is electrically interconnected to the evaluation arrangement 200 (and also to the sensor element 20) and thus provides the sensor signal on the basis of the charge transfers. The sensor signal is specific for the (e.g. proportional to the) sensor capacitance CS. Specifically, the sensor signal is specific for the current intensity of the electric current and/or a voltage present at the terminal 170.A and thus specific for the charge transfer or the sensor capacitance CS.

In order to be able to draw conclusions about the sensor capacitance CS from the sensor signal, the amplifying means 170.2, as shown in FIG. 3, can be electrically interconnected to the sensor element 20 to provide charge transfers (i.e. an electric current flow) between the sensor element 20 and the amplifying means 170.2. Furthermore, the amplifying means 170.2 can electrically connect an output of the transmission element 170.1 to a (in particular inverting) first input of the transmission element 170.1, so that the amplifying means 170.2 forms a counter-coupling for the transmission element 170.1. The counter-coupling enables the charge transfers to be controlled by the control signal when the control signal is applied to the other (in particular non-inverting) second input of the transfer element 170.1. If the first input is directly connected to the terminal 170.A, as shown in FIG. 3, the sensor controlling arrangement 170 provides a voltage follower for the sensor element 20, so that the voltage on the (in particular low impedance) terminal 170.A follows the control signal on the (in particular high impedance) terminal 170.C. This corresponds to the control of the charge transfers at the terminal 170.A by the control signal, and thus to a (particularly low impedance) sensor supply. The sensor signal, on the other hand, can be provided by means of the arrangement (amplifier arrangement) comprising the transmission element 170.1 and the amplifying means 170.2, which can be an electronic amplifier.

Preferably, the transmission element 170.1 is designed as operational amplifier 170.1. In contrast, the amplifying means 170.2 comprises at least one or two filter element(s) 170.2, in which, however, a capacitor C (e.g. in comparison to a resistor R) may dominate. Thus, the configuration of the arrangement comprising the transmission element 170.1 and the amplifying means 170.2 can also be regarded as an integrated circuit. The capacitor C makes it possible to provide an electronic amplifier by this arrangement, in which the sensor signal is generated in the form of an electric voltage proportional to the sensor capacitance CS on the basis of the charge transfers. In other words, the sensor controlling arrangement 170 comprises the arrangement of the transmission element 170.1 and the amplifying means 170.2 to provide the sensor signal with an amplification. This means that the sensor signal is dependent on, and preferably proportional to, a voltage U1 at a first terminal 170.A of the sensor controlling arrangement 170 (or at the first input of the operational amplifier 170.1), amplified by an amplification factor. The amplification factor may be dependent on, and preferably proportional to, a ratio of the sensor capacitance CS to the capacitance Cmess of the capacitor C. The voltage U1 (the output signal) at the terminal 170.A may again substantially correspond to the control signal in the form of a voltage U0 at the terminal 170.C by using the voltage follower or direct counter-coupling. This results in the following relation for the sensor signal, which can be present as voltage U2 at the terminal 170.B of the sensor controlling arrangement 170:

$$U2 = U0 * (1 + CS/Cmess)$$

It can be seen that the sensor signal U2 is amplified depending on the variable sensor capacitance CS and the capacitance Cmess, i.e. it is generated as amplified voltage U0. Consequently, the sensor signal can be used to determine the sensor capacitance CS. In order to enable the displayed linearity between the sensor signal and the sensor capacitance CS, the resistance R of the amplifying means 170.2 is selected as large as possible compared to $(1/(2*\pi*f0*CSmax))$, where f0 is the operating frequency, i.e. in particular the (average) frequency of the control signal, and CSmax is the maximum value of the sensor capacitance CS. If necessary, the capacitance Cmess can be selected identical to the maximum variable sensor capacitance. The setting of Cmess therefore also allows the setting of a dynamic range for the evaluation of the sensor element 20. In addition, the arrangement of the transmission element 170.1 and the amplifying means 170.2 in cooperation with the sensor capacitance CS provides a filter behavior (in particular band-pass behavior), which can be adapted to the working frequency.

The maximum variable sensor capacitance is, for example, the maximum capacitance (capacitance value) that the sensor capacitance CS can take on during the activation action.

It is also conceivable that the amplifying means 170.2 comprises as at least one filter element 140.2 a capacitor C and/or a resistor R, wherein the capacitor C (or the capacitance Cmess of the capacitor C) and/or the resistor R are adapted to a maximum variable sensor capacitance. Preferably the capacitance Cmess of the capacitor C can correspond to the maximum variable sensor capacitance. The capacitor C can be designed for counter-coupling with the transmission element 170.1 (in particular operational amplifier 170.1) of the sensor controlling arrangement 170, and thus preferably form a feedback capacitor C. Via the capacitor C, the output of the transmission element 170.1 and, in particular, the output 170.B, at which the sensor signal is applied, can be fed back to an input of the transmission element 170.1. In addition, this input can be directly connected to the terminal 170.A, to which the sensor element 20 is connected (possibly via a switching element 180), and thus the output signal or an electric voltage of the sensor element 20 is applied. In this way, the output signal can be generated via a direct counter-coupling according to the control signal (follow this). In addition, the control signal or the output signal can be amplified (with an amplification factor depending on the sensor capacitance) depending on the charge transfers at the sensor element 20 (initiated by the output signal), and then be output as the amplified sensor signal at the terminal 170.B.

For the evaluation of the parameter specific for the sensing and in particular the variable sensor capacitance CS, the charge transfer from the sensor element 20 (or the further sensor element 20') to the sensor controlling arrangement 170 is provided according to the above explanations, in order to evaluate this charge transfer on the basis of the sensor signal by an evaluation arrangement 200. For repeated determination, a charge transfer from the sensor element 20 to the sensor controlling arrangement 170 is repeatedly performed in order to charge a storage arrangement 250, preferably an integrator 250, of the evaluation arrangement 200, depending on the amount of the charge transferred in this way. In other words, depending on, and preferably proportional to, the sensor signal, the storage arrangement 250 is charged. In this way, the electric charge stored by the storage arrangement 250 can be specific to the change in capacitance CS. For this purpose, the storage arrangement 250 can provide a storage capacitance CL, for example, by means of a storage capacitor.

The controlling device 300 can be interconnected via a terminal 250.A to the storage arrangement 250 of the evaluation arrangement 200 in order to evaluate the electric charge stored by the storage arrangement 250 for the determination of the parameter specific to the sensing. Thus, an evaluation signal specific to the parameter and/or the stored electric charge is sensed and evaluated. The evaluation signal can, for example, be a voltage across a capacitor of the storage arrangement 250.

It can also be seen in FIG. 3 that the shield controlling arrangement 150 and the sensor controlling arrangement 170 are electrically interconnected via the controlling path KP with the same signal generator arrangement 130 and the same filter arrangement 140. This means that an electric signal (the control signal) generated by the signal generator arrangement 130 and/or filtered by the filter arrangement 140 is used at the controlling path KP for the control both of the sensor element 20 and the shield element 160, preferably with an essentially identical signal form of the signal, preferably an at least approximate sinusoidal form, so that an electric potential difference between the sensor element 20 and the shield element 160 during operation of the arrangement 10 is always minimized during the control and/or sensing.

The shield element 160 can be designed as an active shield element 160 (so-called "active shield") for active shielding of the sensor element 20, so that by means of the shield controlling arrangement 150 an electric potential at the shield element 160 is actively tracked to the electric potential at the sensor element 20. This makes it possible to improve the shielding of the sensor element 20 from the vehicle 1 and thus to reduce a load that exists between the sensor element 20 and the vehicle 1. This load usually leads to a relatively large part of the evaluation signal, which is evaluated by the controlling device 300. The variable part of the evaluation signal due to the variable sensor capacitance CS is reduced and therefore difficult to evaluate. To improve the evaluation, a compensation arrangement 230 is optionally used. Depending on the amplitude of the evaluation signal, for example, it diverts a part of the electric current from the storage arrangement 250. The use of a shield element 160, which comprises the same potential for shielding as the sensor element 20, can further reduce the described difficulties in the evaluation.

The sensor element 20 can be repeatedly charged and discharged via the first terminal 170.A of the sensor controlling arrangement 170 by means of the charge transfers. These repeated charges and discharges can be controlled by the control signal (due to a periodically changing voltage amplitude of the control signal). Depending on the charge transfers, an electric sensor signal can be output via the second terminal 170.B of the sensor controlling arrangement 170. It is possible that an electric filtering of the sensor signal is performed. Correspondingly, filtering for the evaluation branch can be performed when the sensor signal is transmitted to the storage arrangement 250, which therefore has no influence on the electric signal of the electric control (at the controlling path KP) and thus on the charging of the sensor element 20. For this purpose, an evaluation filter arrangement 210 can be used to perform a filtering (such as a band-pass filtering) of the electric sensor signal. This enables the evaluation filter arrangement 210 to filter out interfering immissions from the surroundings of the sensor element 20. Thus, the evaluation filter arrangement 210 can provide an EMC filtering of immissions. For this purpose, the evaluation filter arrangement 210 comprises, for example, a complex resistor and additional filter elements. It is conceivable that the described form (e.g. sinusoidal form) of the electric signal of the electric control at the controlling path KP (i.e. the control signal) affects the electric voltage of the signal. The voltage of the sensor signal at the terminal 170.B can comprise the same form, but possibly an amplified amplitude (proportional to the sensor capacitance CS). However, the evaluation may depend on the charge transfer and thus the electric current during the transmission of the sensor signal to the storage arrangement 250. Therefore, the evaluation filter arrangement 210 can comprise a transconductance converter to perform a transconductance conversion of the sensor signal at the terminal 170.B. Such a transconductance conversion means that a voltage is converted into a proportional current. In other words, the evaluation filter arrangement 210 can be designed for this purpose and/or interconnected in the evaluation arrangement 200 in such a way that an electric current with this form is formed at the output 210.A of the evaluation filter arrangement 210 from the voltage of the electric signal (sensor signal) at the second terminal 170.B with the described form (e.g. sinusoidal form). The transconductance converter is designed e.g. as a transconductance amplifier (using an operational amplifier), but preferably provides the transconductance conversion without operational amplifier due to the interconnection with the storage arrangement 250. This is made possible, for example, by the circuit configuration of the evaluation filter arrangement 210 in series with the storage arrangement 250. Furthermore, the downstream components 220, 250 can be of low impedance and/or the storage arrangement 250 can comprise e.g. at the input 250.B the inverting input (−) of an amplifying element, and in particular of an operational amplifier. The amplifying element of the storage arrangement 250 can be designed so that countermeasures can be initiated immediately if a voltage occurs at the input 250.B. For this purpose, an operational amplifier can regulate the differential voltage of its inputs to zero by means of a feedback. These precautions and/or the arrangement of the evaluation arrangement 200 serial to the storage arrangement 250 comprise the effect that almost no voltage drops at the input 250.B or output 210.A. In other words, there is almost a ground potential at this point (at the input 250.B or at the output 210.A, if they are connected to each other e.g. via a switch of the rectifier arrangement 220), so that this point can be regarded as a virtual zero point.

The block 220 shown in FIG. 3 may involve one or more rectifiers, and thus a rectifier arrangement 220. The rectifier arrangement 220 may be without diodes or the like, so that there is essentially no (or almost no) voltage drop across the rectifier arrangement 220. This can be realized e.g. by using at least one electronic switch, which is clocked. In this way, a virtual zero point for the input 250.B or output 210.A can be provided (when the switch is closed) by the rectifier arrangement 220 and in particular by the at least one switch when establishing the electric connection of the output 210.A with the input 250.B. If, however, the at least one switch is opened, the output 210.A of the evaluation filter arrangement 210 can be connected to a ground potential 21. E.g. the switch connects the output 210.A with the ground potential 21 as a changing switch. In this way, at least approximately one ground potential can always be applied to the output 210.A, independent of the switch position of the at least one switch of the rectifier arrangement 220. This reduces the load on the evaluation filter arrangement 210 considerably.

The described rectification can be a "coherent" rectification by the at least one rectifier. This means that the at least one rectifier passes the electric signal (sensor signal) from the evaluation filter arrangement 210 to the storage arrangement 250, preferably phase-synchronized with the electric control. This causes the sensor signal to be rectified coherently to the control signal. For this purpose, each of the rectifiers can comprise at least one electronic switch. The clock can be set in such a way that only positive (or alternatively negative) half waves of a given fundamental or harmonic of the electric signal (e.g. with the first harmonic as the fundamental of the frequency, which is passed by the evaluation filter arrangement 210 as center frequency, and possibly further harmonics) are passed on. Therefore, the respective clock can be synchronized with the signal generator arrangement 130 to be adapted to the form of the electric signal (control signal) of the electric control. Taking into account the filtering by the evaluation filter arrangement 210, the phase shift between voltage (corresponding to the electric signal of the electric control at the controlling path KP) and current (corresponding to the signal at the output 210.A of the evaluation filter arrangement 210) is taken into account in this synchronization. Furthermore, the rectification can also be performed "incoherently" with diodes, if necessary.

It is also possible that rectification takes the form of one-way rectification, or alternatively both the positive and negative half waves of the sensor signal can be used to transfer charge to the storage arrangement 250.

Furthermore, it may be provided that a frequency of the sensor signal (as a periodic signal) is dependent on an operating frequency, i.e. the frequency of the control signal at the terminal 170.C (or at the output of the filter arrangement 140). Thus, for the entire arrangement 10 a single working frequency can be used for both the control and the evaluation of the sensor element 20 in order to perform the control and evaluation of the sensor element 20 with a given working frequency range. For this purpose, a filtering is used for the electric control (by the filter arrangement 140) and for the evaluation (by the evaluation filter arrangement 210), wherein the filtering is adapted to the working frequency (e.g. forms a low pass and/or band-pass for passing the working frequency range). This allows an optimal evaluation regarding EMC conditions (for emissions) and interfering influences (for immissions).

FIG. 5 shows a possible design of the arrangement 10 according to the invention, if it is used with an elongated sensor element 20. Such a design is used, for example, if the sensor element 20 is to be used in a bumper 1.1 at a front or rear side of the vehicle 1. This makes it possible to sense a movement of the activation means 3 underneath the bumper 1.1 as an activation action, as it is also illustrated in FIG. 6. In contrast to the design of the sensor element 20 as a conductor track of a printed circuit board, as it can be useful for the arrangement in the door handle 1.5 to provide a spatially rather limited detection region, a separate sensor element 20 is connected to the printed circuit board for a larger detection region. For this purpose, e.g. a sensor element terminal 180.A of the circuit board can be used, which provides an electric connection with the switching element 180. This in turn can provide the electric connection via the sensor controlling arrangement 170 and the controlling path KP as well as the filter arrangement 140 to the signal generator arrangement 130 (for charging) or via the evaluation filter arrangement 210 and the rectifier arrangement 220 to the storage arrangement 250 (for evaluation). The above-mentioned components 170, 140, 130, 210, 220, 250 can also be arranged on the circuit board.

The printed circuit board with the components, in other words the controlling arrangement 100 and/or the evaluation arrangement 200, can be regarded as one common component, which will be referred to as sensor switching arrangement 400 in the following. It is optionally possible that this sensor switching arrangement 400 is designed as an individually manageable part that can be mounted on the vehicle. In order to mount the arrangement 10 according to the invention, the sensor switching arrangement 400 can be electrically connected to the sensor element 20 and, if necessary, to at least one further sensor element 20' via at least one sensor supply line 410. The at least one further sensor element 20' can be connected to the sensor switching arrangement 400 via at least one further sensor supply line 410. Optionally, it is also possible that the sensor switching arrangement 400 is electrically connected to at least one shield element 160 or further shield element via a shield line 420, in particular shield supply line 420, or that the shield line 420 forms the shield element 160 (i.e. if necessary also a further shield element).

As an exemplary design for the arrangement 10 according to the invention, a coaxial cable 450 is shown schematically in FIG. 5, whose outer conductor 450.2 is used as the sensor element 20. In other words, the shield 450.2 of the coaxial cable 450 forms the sensor element 20. For this purpose, the sensor supply line 410 can be electrically connected to the outer conductor 450.2 via the terminal 180.A of the sensor switching arrangement 400. The terminal 180.A thereby transmits the electric signal of the electric control, which is given by the signal generator arrangement 130 and/or the filter arrangement 140 (i.e. generated and filtered if necessary) and can further be output by a sensor controlling arrangement 170 at the terminal 180.A. In the same way, a shield element terminal 150.A of the sensor switching arrangement 400 can be used to connect a shield supply line 420 to a shield element 160 (see FIG. 6) or the shield line 420 connected to the shield element terminal 150.A can itself form the shield element 160 (or, if necessary, another shield element). In particular, in the latter case and as shown in FIG. 5, it may be useful to operate the shield element 160 as a passive shield element 160. The inner conductor 450.1 (i.e. the core) of the coaxial cable 450 may remain unconnected if necessary.

When operating as a passive shield element 160, the shield element 160 is connected to a specified constant electric potential via the shield element terminal 150.A during operation (always or during charging and/or discharging of the sensor element 20). The electric potential of the shield element 160 can correspond to a ground potential 21 or be a different potential. In contrast, when operating as an active shield element 160, the electric potential of the shield element 160 can be adjusted and varied depending on the electric potential of the sensor element 20.

It is illustrated by an arrow in FIG. 5 that a twisting of the supply lines 410, 420 can be carried out for mounting the arrangement 10 according to the invention on the vehicle 1. First of all, the shield element 160 can run parallel to the sensor supply line 410 in the form of a shield line 420 as an elongated shield electrode 160. The twisting can be done, e.g., by twisting the sensor supply line 410 and the shield line 420 against each other and winding them helically over each other. The twisted supply lines 410, 420 are highlighted with a dotted and continuous line. In this way, the sensitivity to external electromagnetic interferences can be reduced to the supply lines 410, 420. For mounting, the sensor supply line 410 can then be electrically connected to the outer conductor 450.2 so that the outer conductor 450.2 forms the sensor element 20. The shield line 420 as well as the core 450.1 of the coaxial cable 450 may remain unconnected. Alternatively, the shield line 420 is electrically connected to the core 450.1. In this configuration it is advantageous to use the shield element 160 as passive shield element 160.

Alternatively, it is also useful to operate the shield element 160 or the shield line 420 as active shield element 160. For this purpose, a different interconnection on the coaxial cable 450 is selected if necessary. The sensor supply line 410 can be electrically connected to the core 450.1 (i.e. the inner conductor 450.1) of the coaxial cable 450 so that the core 450.1 serves as sensor supply line. The shield line 420, in this case possibly as shield supply line 420, can be electrically connected with the outer conductor 450.2 (i.e. with the shield) of the coaxial cable 450 so that the outer conductor 450.2 forms the active shield element 160. The coaxial cable 450 with the core 450.1 can be used as a supply line to the sensor element 20, which is then separate from the coaxial cable 450. The outer conductor 450.2, as the active shield element 160, provides improved shielding of the sensor supply line 410. The supply line 410, 420 to the coaxial cable 450 can be twisted as described above, or they can be parallel lines.

A separate sensor element 20, which is connected e.g. via the twisted supply lines 410, 420 described above and/or via the coaxial cable 450 with the outer conductor 450.2 as active shield element 160 and/or via a variant deviating from this, to the sensor switching arrangement 400, is shown as an example in FIG. 6. The sensor element 20 can, for example, be designed as an electrically conductive surface (so-called flat electrode 20) and/or as an electrically conductive line or similar. The sensor element 20 is shown in a mounted arrangement (e.g. in the rear region) near other parts of the vehicle 1. Schematically indicated is a part of the vehicle 1 which can be considered as ground potential 21. The vehicle 1 can cause a load on the sensor element 20 which can be counteracted by a shield. The electric field which can occur between a shield element 160 and the sensor element 20 (and which can be reduced or eliminated by operating the shield element 160 as an active shield element 160) and which serves for the sensing of the activation action or the activation means 3 is indicated by arrows.

The form of the (active) shield element 160 shown here is particularly advantageous. The form is e.g. a U-form, wherein the two opposite side parts 160.2 of the shield element 160 shield a side region and a central part 160.1 of the shield element 160 the central region or the vehicle side. In this way the detection region can be defined very precisely by the open region 160.3 of the shield element 160 between the side parts 160.2. The shield element 160 can be operated as an active shield element 160 e.g. by electrically connecting it to the shield (supply) line 420 or to an outer conductor 450.2 of the coaxial cable 450 (if used as supply line). Furthermore, the sensor element 20 can be electrically connected to the sensor supply line 410 and/or to the core 450.1 of the coaxial cable 450 (if this is used as supply line). Alternatively, the form can be different from a U-form, in particular if the shield element 160 is wider than the sensor element 20.

FIG. 4 shows an evaluation filter arrangement 210, a rectifier arrangement 220 and a storage arrangement 250 with further details. The evaluation filter arrangement 210 may comprise several filter elements 210.1 for filtering the sensor signal, which is preferably provided as a voltage signal by the sensor controlling arrangement 170. These filter elements can each be designed as resistor, coil and/or capacitor, for example, and thus be designed as RC and/or RLC and/or RL element. By the interconnection and design of the filter elements 210.1, a low and high pass behavior of the evaluation filter arrangement 210 can be set, and thus a band-pass filter can be provided. This band-pass filter is advantageously adapted to a frequency of the electric control, in particular an operating frequency of the control signal, with regard to its passband and/or center frequency. By serial interconnection with a virtual zero point 250.B of the storage arrangement 250, the filtered sensor signal can then be transferred as a current signal to the storage arrangement 250. The current signal can comprise a current intensity which corresponds to the voltage signal with respect to amplitude and/or signal form. In this way, a charge transfer to and thus charging of the storage arrangement 250 can take place.

In order to enable charge transfer only in the direction of the storage arrangement 250, a rectifier arrangement 220 can be interconnected between the evaluation filter arrangement 210 and the storage arrangement 250. In this case it is desirable that only certain half waves of the sensor signal are transmitted to the storage arrangement 250 in order to cause only a charging of the storage arrangement 250 but no discharge by the sensor signal. For this purpose, the rectifier arrangement 220 can comprise at least one controllable rectifier 220.1, preferably in the form of a synchronous rectifier or the like, which carries out the rectification of the sensor signal synchronously, in particular coherently, to the control signal. It is therefore necessary that the signal form of the sensor signal (in particular the filtered sensor signal and thus the current signal) is known. It is taken advantage of the fact that the sensor signal is generated by the sensor controlling arrangement 170 on the basis of the control signal, and thus corresponds to the signal form of the control signal (the amplification compared to the control signal may, however, depend on the sensor capacitance CS). To enable synchronization, the rectifier arrangement 220, in particular the at least one rectifier 220.1, can therefore be controlled by the controlling device 300. The controlling device 300 can in turn control the signal generator arrangement 130 to generate the control signal so that the controlling device 300 knows the signal form. In this way, the rectification of the sensor signal is "coherent".

Furthermore, FIG. 4 shows that the rectifier arrangement 220 can comprise several rectifiers 220.1, preferably half wave rectifiers or full wave rectifiers, which are connected to the controlling arrangement 100 and/or controlling device 300. As an example, a first rectifier 220.1a, a second rectifier 220.1b and a third rectifier 220.1c are shown. These serve to be controlled by the controlling device 300 at different frequencies, in particular clocked and/or coherent and/or synchronized to the electric control signal, in such a way that one 220.1a of the rectifiers 220.1 transmits only a half oscillation of a fundamental oscillation, in particular first harmonic, of the electric sensor signal to the storage arrangement 250, and the at least one further rectifier 220.1b, 220.1c suppresses the transmission, in particular of this half oscillation, of further harmonics of the electric sensor signal to the storage arrangement 250. The at least one further rectifier 220.1b, 220.1c can also, if necessary, permit the transmission of the other half oscillation of the further harmonic of the electric sensor signal to the storage arrangement 250. This principle is further illustrated in FIG. 7. Here, the rectification 504 is represented by the rectifier arrangement 220 in which the first rectifier 220.1a only switches at the negative half wave according to the fundamental wave (see switching sequence 505) and the second rectifier 220.1b only switches at the positive half wave according to another harmonic (e.g. 3rd harmonic) (see switching sequence 506). In this way, a rectified transmission of the sensor signal according to the fundamental oscillation with simultaneous suppression of interfering frequency components according to the harmonics can be achieved.

Furthermore, it is shown in FIG. 4 that the rectifier arrangement 220 comprises at least one electronic switch 220.2. In particular, the individual rectifiers 220.1 can each be designed as or comprise a switch 220.2. The at least one switch 220.2 (FIG. 4 shows three switches 220.2) can be connected to the controlling device 300 via a control path 220.3 in order to electrically connect the storage arrangement 250 with the transmission arrangement 170, 210 for the transmission of the electric sensor signal for certain half oscillations, in particular negative half oscillations, of the electric control signal. For this purpose, a control signal of control path 220.3 for switching the respective switch 220.2 can be synchronized with the electric control signal. The control signal can be output e.g. by the controlling device 300.

FIG. 7 schematically visualizes a method for the vehicle 1 for the detection of an activation action for the activation of a function at the vehicle 1. According to a first method step 501, an electric sensor signal is provided which is specific for a parameter of the sensor element 20, wherein the parameter in turn is specific for the sensed change in the surroundings. Furthermore, according to a second method step 502, the parameter of the sensor element 20 is repeatedly determined by means of a transmission of the sensor signal to a storage arrangement 250. In addition, according to a third method step 503, a band-pass filtering and/or transconductance conversion of the sensor signal for the transmission to the storage arrangement 250 is carried out.

The above explanation of the embodiments describes the present invention exclusively in the context of examples. Of course individual features of the embodiments can be freely combined with each other, if technically reasonable, without leaving the scope of the present invention.

LIST OF REFERENCE SIGNS 1 vehicle
1.1 bumper
1.2 rear region
1.3 tailgate
1.4 side region
1.5 door handle
1.6 door
1.7 front region
2 user
3 activation means
identification transmitter
8 control apparatus
arrangement
sensor element, sensor electrode
20 further sensor element
21 ground potential
100 controlling arrangement
130 signal generator arrangement, signal generator
130.1 digital-analogue-converter
140 filter arrangement, active filter, sinusoidal filter
140.1 operational amplifier
140.2 filter element
150 shield controlling arrangement
150.A shield element terminal
150.1 operational amplifier
160 shield element
160.1 central part
160.2 side part, leg
160.3 detection region, open region
170 sensor controlling arrangement, voltage follower
170.A first terminal of 170
170.B evaluation path, second terminal of 170
170.1 operational amplifier
170.2 filter element
180 switching element
180.A output of 180, sensor element terminal
200 evaluation arrangement
210 evaluation filter arrangement
210.A first terminal or output of 210
220 rectifier arrangement
230 compensation arrangement
250 storage arrangement, integrator
250.A first terminal
250.B second terminal, input
300 controlling device, microcontroller
400 sensor switching arrangement
410 sensor supply line
420 shield supply line
450 coaxial cable
450.1 inner conductor, core
450.2 outer conductor
501 first method step
502 second method step
503 third method step
CL storage capacitance
CS sensor capacitance
KP controlling path

The invention claimed is:

1. A vehicle arrangement for detecting an activation action for activating a function on a vehicle comprising:
at least one sensor element for sensing a change in the surroundings of the sensor element, a controlling arrangement which is electrically connected to the sensor element to provide an electric sensor signal specific to a parameter of the sensor element, wherein the parameter in turn is specific to the sensed change in the surroundings, an evaluation arrangement for repeatedly determining the parameter of the sensor element by means of a transmission of the sensor signal to a storage arrangement in order to perform the detection of the activation action, and an evaluation filter arrangement of the evaluation arrangement at least for band-pass filtering and for transconductance conversion of the sensor signal for the transmission to the storage arrangement, wherein the controlling arrangement provides a control signal for an electric control of the sensor element for initiating charge transfers at the sensor element by means of the control signal, wherein the evaluation filter arrangement provides band-pass filtering with a center frequency and bandwidth which is adapted to a frequency of the control signal in order to suppress interfering immissions on the vehicle arrangement from the surroundings, during repeated determination or during the transmission to the storage arrangement.

2. The vehicle arrangement according to claim 1, wherein
a sensor controlling arrangement of the controlling arrangement is electrically interconnected to the sensor element in order to initiate charge transfers between the sensor element and the sensor controlling arrangement and to provide the sensor signal on the basis of the charge transfers, wherein the evaluation filter arrangement is electrically interconnected to the storage arrangement and to the sensor controlling arrangement in order to filter the sensor signal and transmit it filtered to the storage arrangement.

3. The vehicle arrangement according to claim 1, wherein
the storage arrangement is serially interconnected to the evaluation filter arrangement via an input, and an input resistance of the storage arrangement is so low that a virtual zero point is formed at the input.

4. The vehicle arrangement according to claim 1, wherein
the evaluation filter arrangement is designed as a passive or active filter.

5. The vehicle arrangement according to claim 1, wherein
the evaluation filter arrangement comprises a bandwidth in the range from 100 kHz to 1 MHz.

6. The vehicle arrangement according to claim 1, wherein
the controlling arrangement comprises a filter arrangement in order to provide an electric control signal for the electric control of the sensor element at least filtered or formed.

7. The vehicle arrangement according to claim 1, wherein
the controlling arrangement comprises a filter arrangement which connects a signal generator arrangement via a controlling path to the sensor element in order to provide an electric control signal generated by the signal generator arrangement at the controlling path at least filtered or formed for the sensor element, and thereby provide the electric control signal as a filtered electric signal.

8. The vehicle arrangement according to claim 1, wherein
the evaluation filter arrangement is provided in addition to a filter arrangement of the controlling arrangement in order to additionally filter immissions on the sensor element for the determination of the parameter.

9. The vehicle arrangement according to claim 1, wherein
the sensor element is designed as a sensor electrode to provide the parameter specific to the sensing as a variable capacitance, wherein the change of the capacitance is specific to the change in the surroundings, wherein the vehicle arrangement is adapted for the repeated determination to:
repeatedly initiate charge transfers by means of a control signal between the sensor element and a sensor controlling arrangement, and in response thereto,
repeatedly initiate charge transfers by means of the sensor signal between the sensor controlling arrangement and the storage arrangement of the evaluation arrangement, so that an electric charge stored by the storage arrangement is specific to the change in the capacitance.

10. The vehicle arrangement according to claim 1, wherein
a controlling device is interconnected to the storage arrangement of the evaluation arrangement in order to evaluate an electric charge stored by the storage arrangement for determining the parameter specific to the sensing.

11. The vehicle arrangement according to claim 1, wherein
the vehicle arrangement is at least partially integrated as a capacitive sensor arrangement in a bumper of the vehicle in order to monitor the rear region of the vehicle, and in order to open a tailgate of the vehicle as the function on the vehicle.

12. The vehicle arrangement according to claim 1, wherein
the vehicle arrangement is designed to repeatedly charge and discharge the sensor element by an electric control of the sensor element, and to carry out charge transfers by the sensor signal to the storage arrangement depending on at least this charging or discharging, wherein a controlling device is at least electrically connected to:
a signal generator arrangement, in order to initiate the electric control at the signal generator arrangement, or
the storage arrangement in order to evaluate, after a charge transfer, the amount of charge at least stored in the storage arrangement or accumulated after several charge transfers, and to perform the detection on the basis of the evaluation.

13. The vehicle arrangement according to claim 1, wherein
the evaluation filter arrangement is configured for transconductance conversion of the sensor signal for the transmission to the storage arrangement; and
a sensor controlling arrangement is electrically interconnected to the sensor element in order to generate an electric voltage signal with at least a specific frequency or signal form at an output at least on the basis of a control signal or on the basis of charge transfers at the sensor element, wherein the evaluation filter arrangement is designed to convert the voltage signal into an electric current signal with the same signal form or frequency for charge transfers to the storage arrangement, so that the sensor signal is produced as the electric current signal by the transconductance conversion.

14. The vehicle arrangement according to claim 1, wherein
a rectifier arrangement is interconnected between the evaluation filter arrangement and the storage arrangement in order to forward only charge transfers by the sensor signal in the direction of the storage arrangement to the storage arrangement by repeated switching, wherein the rectifier arrangement comprise several rectifiers which are electrically connected with the control arrangement.

15. A system comprising:
a vehicle arrangement according to claim 1,
a controlling device for outputting an activation signal in case of the detection of the activation action, and
a control apparatus which is connected to the controlling device in order to perform the function on the vehicle when the activation signal is received.

16. A method for a vehicle for detecting an activation action for activating a function on the vehicle with a sensor element for sensing a change in the surroundings of the sensor element,
wherein the following steps are carried out:
providing, by a controlling arrangement which is electrically connected to the sensor element, an electric sensor signal which is specific for a parameter of the sensor element, wherein the parameter in turn is specific for the sensed change in the surroundings,
performing a repeated determination of the parameter of the sensor element by means of a transmission of the sensor signal to a storage arrangement, and
performing at least band-pass filtering and transconductance conversion of the sensor signal for the transmission to the storage arrangement,
wherein the controlling arrangement provides a control signal for an electric control of the sensor element for initiating charge transfers at the sensor element by means of the control signal, wherein an evaluation filter arrangement provides band-pass filtering with a center frequency and bandwidth which is adapted to a frequency of the control signal in order to suppress interfering immissions on the vehicle arrangement from the surroundings, during repeated determination or during the transmission to the storage arrangement.

17. A vehicle arrangement for detecting an activation action for activating a function on a vehicle comprising:
at least one sensor element for sensing a change in the surroundings of the sensor element,
a controlling arrangement which is electrically connected to the sensor element to provide an electric sensor signal specific to a parameter of the sensor element, wherein the parameter in turn is specific to the sensed change in the surroundings,
an evaluation arrangement for repeatedly determining the parameter of the sensor element by means of a transmission of the sensor signal to a storage arrangement in order to perform the detection of the activation action, and
an evaluation filter arrangement of the evaluation arrangement at least for band-pass filtering and for transconductance conversion of the sensor signal for the transmission to the storage arrangement,
wherein the controlling arrangement provides a control signal for an electric control of the sensor element for initiating charge transfers at the sensor element by means of the control signal, wherein the evaluation filter arrangement provides band-pass filtering with a center frequency and bandwidth which is adapted to a frequency of the control signal in order to suppress interfering immissions on the vehicle arrangement from the surroundings, during repeated determination or during the transmission to the storage,
wherein the evaluation filter arrangement is a passive or active filter comprising several filter elements.

18. A vehicle arrangement for detecting an activation action for activating a function on a vehicle comprising:
at least one sensor element for sensing a change in the surroundings of the sensor element,
a controlling arrangement which is electrically connected to the sensor element to provide an electric sensor signal specific to a parameter of the sensor element, wherein the parameter in turn is specific to the sensed change in the surroundings,
an evaluation arrangement for repeatedly determining the parameter of the sensor element by means of a transmission of the sensor signal to a storage arrangement in order to perform the detection of the activation action, and
an evaluation filter arrangement of the evaluation arrangement at least for band-pass filtering and for transconductance conversion of the sensor signal for the transmission to the storage arrangement,
wherein the controlling arrangement provides a control signal for an electric control of the sensor element for initiating charge transfers at the sensor element by means of the control signal, wherein the evaluation filter arrangement provides band-pass filtering with a center frequency and bandwidth which is adapted to a frequency of the control signal in order to suppress interfering immissions on the vehicle arrangement from the surroundings, during repeated determination or during the transmission to the storage,
wherein supply lines for mounting the vehicle arrangement on the vehicle are twisted.

* * * * *